(12) United States Patent  (10) Patent No.: US 8,391,061 B2
Elmhurst et al.  (45) Date of Patent: Mar. 5, 2013

(54) FLASH MEMORY AND ASSOCIATED METHODS

(75) Inventors: Daniel Elmhurst, Folsom, CA (US);
Giovanni Santin, Rieti (IT); Michele Incarnati, Gioia dei Marsi (IT);
Violante Moschiano, Bacoli (IT);
Ercole Diiorio, Scurcola Marsicana (IT)

(73) Assignee: Intel Corporation, Santa Clara, CA (US)

( * ) Notice: Subject to any disclaimer, the term of this patent is extended or adjusted under 35 U.S.C. 154(b) by 281 days.

(21) Appl. No.: 12/643,610

(22) Filed: Dec. 21, 2009

(65) Prior Publication Data

US 2010/0097856 A1  Apr. 22, 2010

Related U.S. Application Data

(63) Continuation-in-part of application No. 11/618,652, filed on Dec. 29, 2006, now abandoned.

(51) Int. Cl.
G11C 16/04 (2006.01)

(52) U.S. Cl. ......... 365/185.03; 365/185.18; 365/185.19; 365/185.2; 365/185.21; 365/185.28

(58) Field of Classification Search ............. 365/185.03, 365/185.18, 185.19, 185.2, 185.21, 185.28
See application file for complete search history.

(56) References Cited

U.S. PATENT DOCUMENTS

| 6,181,603 B1 | 1/2001 | Jyouno et al. |
| 6,259,628 B1 * | 7/2001 | Park ..................... 365/185.22 |
| 6,480,417 B2 | 11/2002 | Elmhurst |
| 6,618,287 B2 | 9/2003 | Elmhurst |
| 6,700,820 B2 | 3/2004 | Elmhurst et al. |
| 6,747,893 B2 | 6/2004 | Uribe et al. |
| 6,809,626 B2 | 10/2004 | Chu et al. |
| 6,809,962 B2 | 10/2004 | Uribe et al. |
| 6,879,520 B2 | 4/2005 | Hosono et al. |

(Continued)

FOREIGN PATENT DOCUMENTS

| JP | 2005196871 A | 1/2004 |
| KR | 10-0458408 B1 | 11/2004 |

(Continued)

OTHER PUBLICATIONS

"U.S. Appl. No. 11/618,652, Response filed Sep. 26, 2008 to Restriction Requirement mailed Sep. 4, 2008", 11 pgs.

(Continued)

*Primary Examiner* — Hoai V Ho
(74) *Attorney, Agent, or Firm* — Schwegman, Lundberg & Woessner, P.A.

(57) ABSTRACT

In a method of operation, a flash memory cell coupled to a bit-line is programmed, a word-line voltage is coupled to the flash memory cell, a first voltage pulse is coupled to a bias transistor coupled between the bit-line and a sense capacitance at a first time to couple the bit-line to the sense capacitance to generate data to indicate the state of the flash memory cell, a second voltage pulse is coupled to the bias transistor at a second time having a second magnitude that is different from a first magnitude of the first voltage pulse, and a third voltage pulse is coupled to the bias transistor at a third time having a third magnitude that is different from the second magnitude of the second voltage pulse. In a method of operation, the second voltage pulse occurs a first delay period after the first voltage pulse and the third voltage pulse occurs a second delay period after the second voltage pulse, the second delay period being different from the first delay period.

15 Claims, 13 Drawing Sheets

U.S. PATENT DOCUMENTS

| | | | |
|---|---|---|---|
| 7,075,822 | B2 | 7/2006 | Elmhurst et al. |
| 7,180,787 | B2 | 2/2007 | Hosono et al. |
| 2002/0126531 | A1 | 9/2002 | Hosono et al. |
| 2004/0130946 | A1 | 7/2004 | Uribe et al. |
| 2005/0146959 | A1 | 7/2005 | Shiga |
| 2005/0213385 | A1 | 9/2005 | Hosono et al. |
| 2005/0276108 | A1 | 12/2005 | Guterman |
| 2006/0034140 | A1* | 2/2006 | Ogawa et al. ............ 365/230.03 |
| 2006/0067130 | A1 | 3/2006 | Jeong |
| 2006/0104112 | A1 | 5/2006 | Hosono et al. |
| 2006/0155919 | A1 | 7/2006 | Lasser et al. |
| 2007/0002615 | A1 | 1/2007 | Lee et al. |
| 2008/0158986 | A1 | 7/2008 | Elmhurst et al. |

FOREIGN PATENT DOCUMENTS

| | | |
|---|---|---|
| KR | 2006-0044855 A | 5/2006 |
| WO | WO-2008083125 A1 | 7/2008 |

OTHER PUBLICATIONS

"U.S. Appl. No. 11/618,652, Restriction Requirement mailed Sep. 8, 2008", 4 pgs.

"Taiwanese Application Serial No. 096144924, Office Action mailed Aug. 31, 2011", (w/ English Translation of Search Report), 11 pgs.

"U.S. Appl. No. 11/618,652 Non-Final Office Action mailed Nov. 17, 2008", 14 pgs.

"U.S. Appl. No. 11/618,652, Final Office Action mailed Apr. 17, 2009", 14 pgs.

"U.S. Appl. No. 11/618,652, Final Office Action mailed Aug. 11, 2009", 13 pgs.

"U.S. Appl. No. 11/618,652, Response filed Mar. 17, 2009 to Non Final Office Action mailed Nov. 17, 2008", 14 pgs.

"U.S. Appl. No. 11/618,652, Response filed Jul. 29, 2009 to Final Office Action mailed Apr. 17, 2009", 16 pgs.

"International Application No. PCT/US2007/088743, Search Report", (Apr. 17, 2008), 3 pgs.

"International Application No. PCT/US2007/088743, Written Opinion", (Apr. 17, 2008), 5 pgs.

Jung, T.-S., et al., "A 3.3-V Single Power Supply 16-Mb Nonvolatile Virtual DRAM Using NAND Flash Memory Technology", *IEEE Journal of Solid-State Circuits*, 32(11), (Nov. 1997), 1748-1757.

Sakui, K., et al., "A Sophisticated Bit-by-Bit Verifying Scheme for NAND EEPROM's", *1998 Symposium on VLSI Circuits, Digest of Technical Papers*, (1998), 236-237.

Tanaka, T., et al., "A Quick Intelligent Page-Programming Architecture and a Shielded Bitline Sensing Method for 3 V-Only NAND Flash Memory", *IEEE Journal of Solid-State Circuits*, 29(11), (Nov. 1994), 1366-1373.

"Korean Application Serial No. 10-2009-7013488, Office Action mailed Dec. 3, 2010", (w/ English Translation), 9 pgs.

"Chinese Application Serial No. 200780048999.5, Office Action mailed Oct. 8, 2011", 21 pgs.

"Japanese Application Serial No. 2009-544240, Office Action mailed Jan. 10, 2012", 3 pgs.

"Taiwanese Application Serial No. 96144924, Office Action Response filed Feb. 16, 2012", 2 pgs.

"Taiwan Application Serial No. 96144924, Office Action mailed Jul. 20, 2012", 10 pgs.

\* cited by examiner

FLASH MEMORY AND ASSOCIATED METHODS

RELATED APPLICATIONS

This application is a continuation-in-part of U.S. patent application Ser. No. 11/618,652, filed on Dec. 29, 2006 now abandoned, which is incorporated herein by reference in its entirety.

TECHNICAL FIELD

The subject matter relates generally to non-volatile memory devices, and more particularly, to reading and writing data in flash memory devices.

BACKGROUND

Non-volatile memory devices are becoming more and more popular in consumer electronics. An example of a non-volatile memory device is a flash memory device that stores information in a semiconductor device without the need for power to maintain the information.

There is a need for improved methods of reading and writing data in flash memory devices.

DETAILED DESCRIPTION

The embodiments described herein are merely illustrative. Therefore, the embodiments shown should not be considered as limiting of the claims.

According to various embodiments, the term pulse refers to the application of a selected voltage level to a terminal for a finite time period. Those skilled in the art will understand that a single pulse may be applied continuously for the finite time period, or may include a series of shorter discrete pulses applied in sequence and having a summed or total time period equal to the finite time period.

According to various embodiments, each transistor or floating gate transistor memory cell is described as being activated or switched on when it is rendered conductive by a voltage on its gate that exceeds its threshold voltage $V_t$, and the transistor or floating gate transistor memory cell is described as being in an inactive state or switched off when the voltage on its gate is below the threshold voltage $V_t$ and the transistor or floating gate transistor memory cell is non-conductive.

According to various embodiments, a voltage is evaluated by comparing it with a reference voltage. According to various embodiments, a voltage is evaluated by coupling the voltage to an input of an inverter to compare the voltage with a threshold voltage of the inverter. The inverter may be in a latch circuit. A state of an output of the inverter may change depending on the voltage at its input and its threshold voltage.

All timing diagrams illustrated and described herein show voltages or signals v versus time t.

Figure 1:
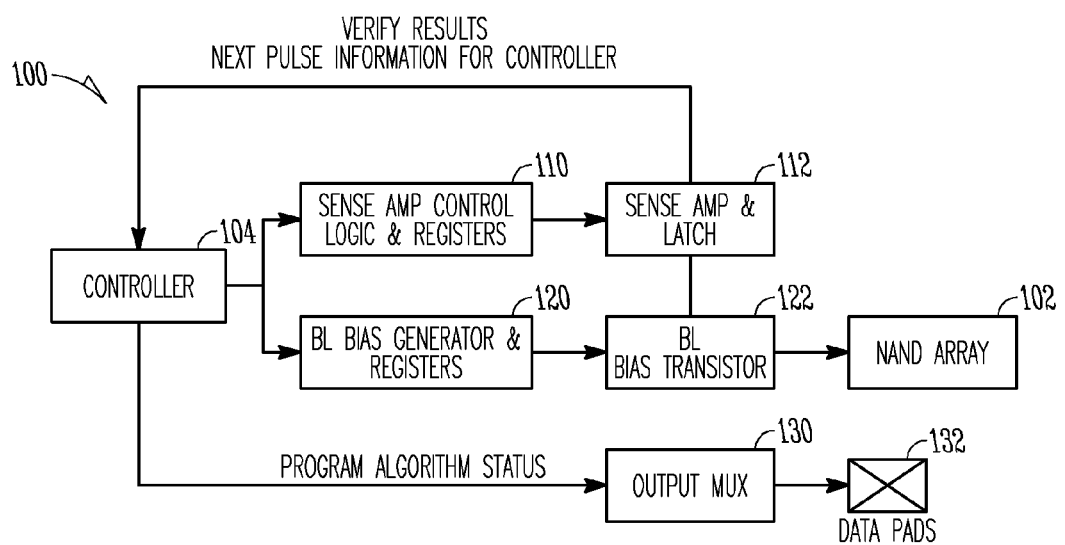
FIG. 1 illustrates a block diagram of a memory system according to various embodiments.

FIG. 1 illustrates a block diagram of a memory system 100 according to various embodiments. The memory system 100 may be called an article. The memory system 100 includes an array 102 of electrically erasable and programmable read only memory devices (EEPROM). The EEPROMs in the array 102 are also called flash memory cells or floating gate transistor memory cells. The floating gate transistor memory cells may have one of two threshold voltages $V_t$, or may be multi-state cells holding one of four or more threshold voltages $V_t$. The memory system 100 also includes a controller 104. The controller 104 is coupled to provide instructions to sense amplifier control logic and registers 110 which in turn is coupled to provide control signals to a sense amplifier and latch 112. The controller 104 is also coupled to provide instructions to a bit-line bias generator and registers 120 which is in turn coupled to provide a control signal to a bit-line bias transistor 122. The sense amplifier and latch 112 and the bit-line bias transistor 122 are both coupled to the array 102 to sense and latch data from flash memory cells in the array 102. The sense amplifier and latch 112 and the bit-line bias transistor 122 may also be referred to as a cache memory for the memory system 100 since they perform the function of cache memory. Data latched from the array 102 in the sense amplifier and latch 112 is coupled to the controller 104. The controller 104 processes data from the sense amplifier and latch 112 and couples the data to an output multiplexer 130, which in turn couples the data to data pads 132.

The controller 104 is a machine and may be a processor, a microprocessor, a state machine, or an application-specific integrated circuit that is a computer-readable medium, or is coupled to a computer-readable medium or a machine-accessible medium such as a memory, in a computer-based system to execute functions and methods according to various embodiments described herein. The memory may be the array 102 or may include electrical, optical, or electromagnetic elements. The computer-readable medium or a machine-accessible medium may contain associated information such as computer program instructions, data, or both which, when accessed, results in a machine performing the activities described herein.

Figure 2:
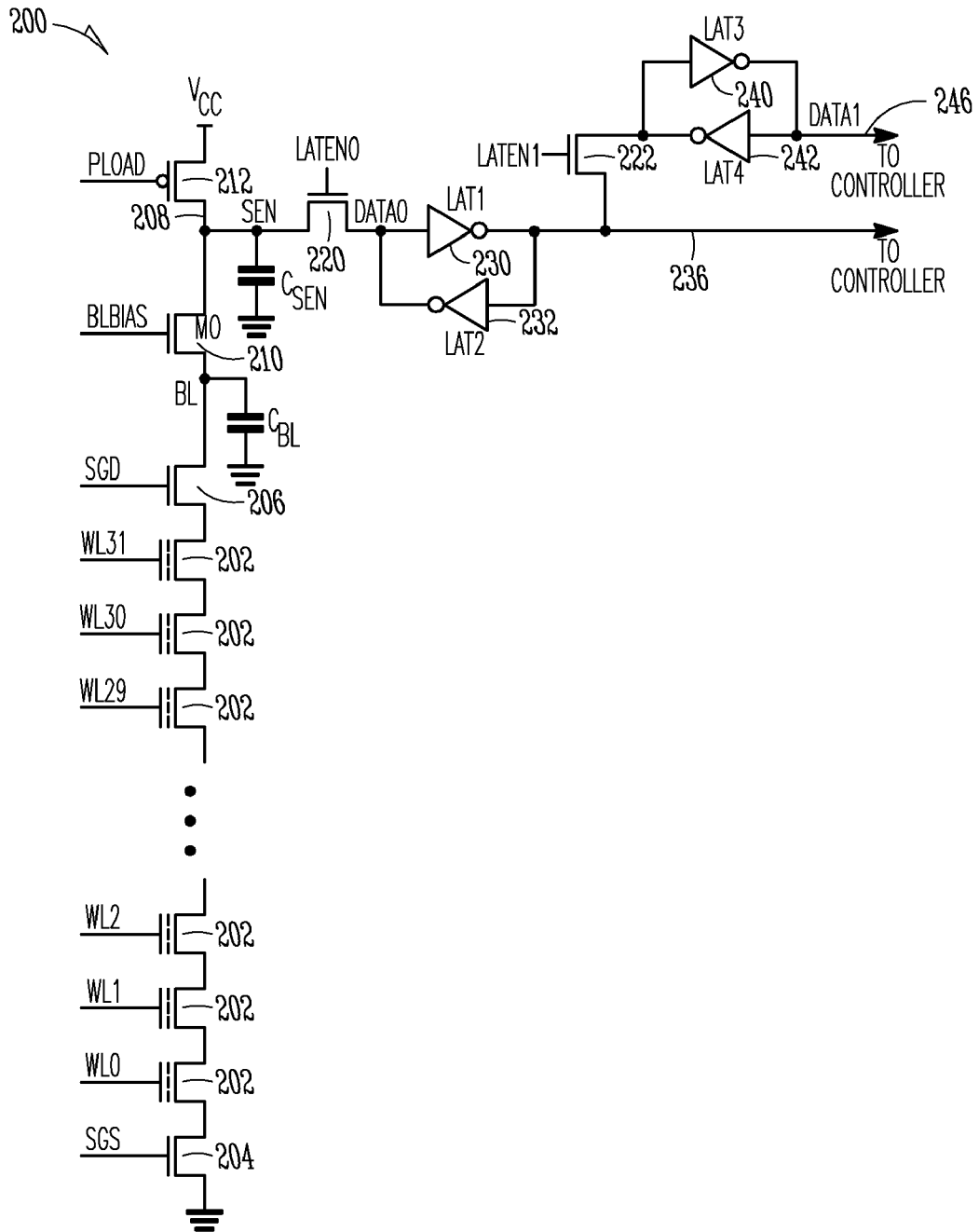
FIG. 2 illustrates an electrical schematic diagram of a memory circuit according to various embodiments.

FIG. 2 illustrates an electrical schematic diagram of a memory circuit 200 according to various embodiments. Illustrated in FIG. 2 is a nandstring of flash memory cells or floating gate transistor memory cells 202. There are 32 flash memory cells 202 in the nandstring, numbered 0 to 31. The nandstring of flash memory cells 202 is located in the array 102 with other nandstrings of flash memory cells. Each flash memory cell 202 is controlled by a respective one of 32 word-line signals WL0 to WL31 coupled to its gate terminal.

Each flash memory cell 202 includes a source, a drain, a floating gate and a control gate. The flash memory cells 202 are coupled drain to source in each nandstring. The nandstring includes a source select transistor 204, an n-channel transistor coupled between a source of the first flash memory cell 202 and a ground voltage reference. At the other end of the nandstring, a drain select transistor 206 is an n-channel transistor coupled between a drain of the last flash memory cell 202 and the rest of the memory circuit 200. The drain select transistor 206 is coupled in series between the nandstring and a bit-line 208 with a bias transistor MO 210 and a load transistor 212. The bit-line 208 has a voltage BL and a capacitance $C_{BL}$. The bias transistor 210 is an n-channel transistor having a source coupled to the drain select transistor 206 and a drain. The load transistor 212 is a p-channel transistor having a drain coupled to the drain of the bias transistor 210 and a source coupled to a voltage supply Vcc. A source select control signal SGS is coupled to a control gate of the source select transistor 204, and a drain select control signal SGD is coupled to a control gate of the drain select transistor 206. A control signal BLBIAS is coupled to a control gate of the bias transistor 210, and a control signal PLOAD is coupled to a control gate of the load transistor 212. The bias transistor 210 is one of multiple bias transistors 122 in the memory system 100 shown in FIG. 1.

The bit-line 208 is coupled to the sense amplifier and latch 112 of the memory system 100 between the bias transistor 210 and the load transistor 212. The sense amplifier and latch 112 includes multiple latch transistors and inverters, one set of which is illustrated in FIG. 2 for latching data from the flash memory cells 202. A first latch transistor 220 and a second latch transistor 222 control data transfer from the nandstring. The first and second latch transistors 220, 222 are n-channel transistors, each having a control gate coupled to a respective control signal LATEN0 and LATEN1. A coupling between the first latch transistor 220 and the bit-line 208 has a voltage SEN and a capacitance $C_{SEN}$ that is much smaller than $C_{BL}$. The voltage SEN driven by the capacitance $C_{SEN}$ is unlatched data from the nandstring and will be further described hereinbelow. A first latch includes a first inverter 230 and a second inverter 232. The first inverter 230 has an input coupled to a source of the first latch transistor 220 and an output coupled to an input of the second inverter 232. An output of the second inverter 232 is coupled to the input of the first inverter 230 and the source of the first latch transistor 220. A drain of the first latch transistor 220 is coupled to the bit-line 208 and the voltage SEN. The input of the second inverter 232 and the output of the first inverter 230 are coupled to a data line 236 that is coupled to the controller 104 shown in FIG. 1.

A second latch including a third inverter 240 and a fourth inverter 242 is coupled through the second latch transistor 222 to the data line 236. An input of the third inverter 240 and an output of the fourth inverter 242 are coupled to a source of the second latch transistor 222, and a drain of the second latch transistor 222 is coupled to the data line 236. An output of the third inverter 240 and an input of the fourth inverter 242 are coupled to a second data line 246 that is coupled to the controller 104 shown in FIG. 1.

Each of the flash memory cells 202 is programmed according to various embodiments by coupling a program pulse to its gate to induce charge to be drawn to the floating gate to raise the threshold voltage $V_t$ of the flash memory cell 202. Early in the programming, strong program pulses are applied to the gate resulting in a large change in the threshold voltage $V_t$. As the threshold voltage $V_t$ of the flash memory cell 202 approaches a target, weaker program pulses are applied to the gate resulting in smaller changes in the threshold voltage $V_t$. After each program pulse, the threshold voltage $V_t$ is verified twice before another program pulse is applied.

A selected flash memory cell 202 is read according to various embodiments by coupling a read voltage to its gate (WL0 to WL31), rendering the source select transistor 204 and the drain select transistor 206 conductive and switching on all the other floating gate cells 202 in the nandstring such that they are also conductive. The bias transistor 210 and the load transistor 212 are switched on such that the bit-line 208 is charged from the voltage Vcc. The load transistor 212 is then switched off and charge on the bit-line 208 will flow through the selected flash memory cell 202 if it is not programmed, such that the voltage BL on the bit-line 208 decreases once the load transistor 212 is switched off. However, if the selected flash memory cell 202 has been programmed, then charge on the bit-line 208 will flow more slowly, and may not flow at all through the nandstring. The first and second latches including the inverters 230, 232, 240, and 242, and the first and second latch transistors 220 and 222 are capable of latching data from the bit-line 208 as will be described.

Figure 3:
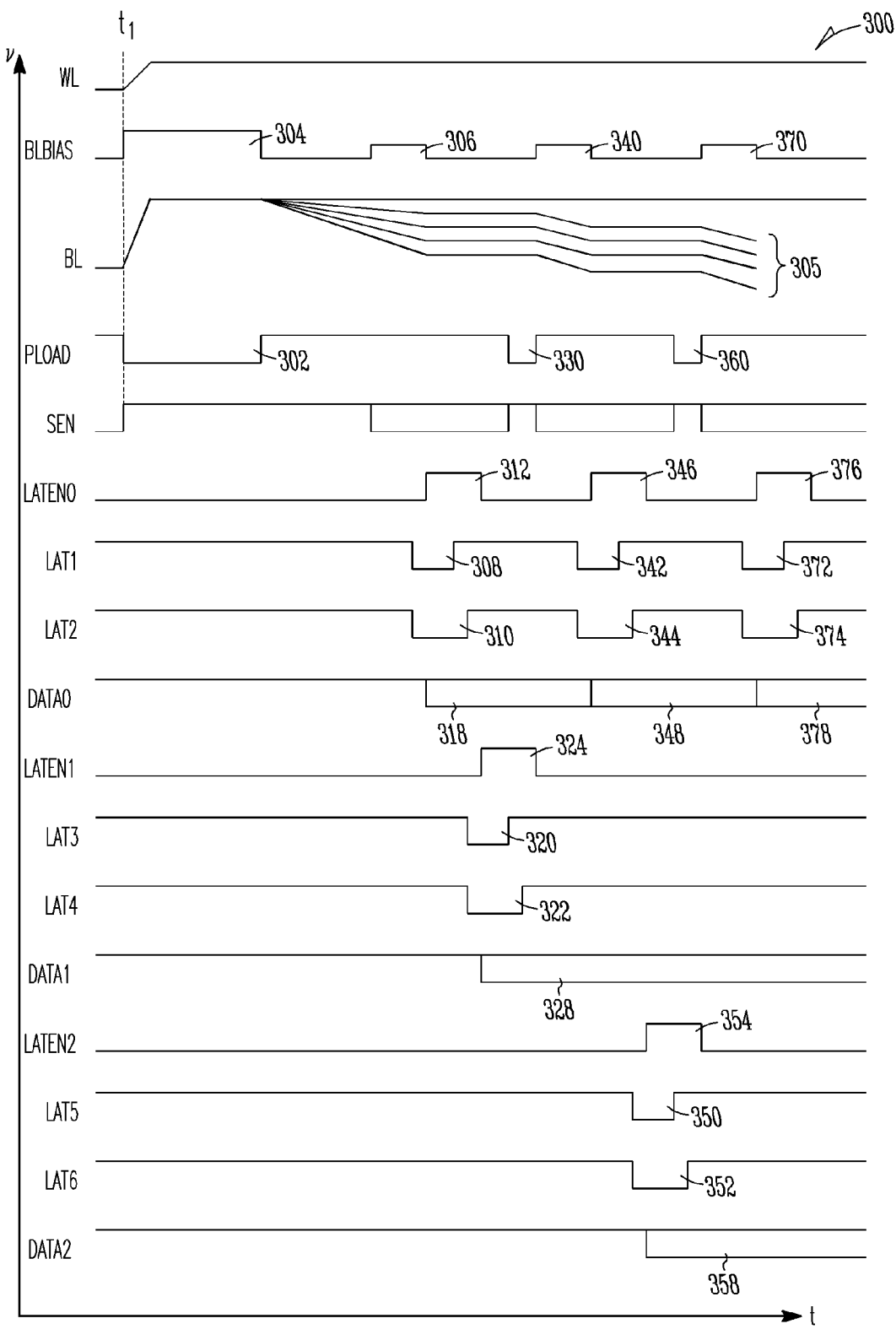
FIG. 3 illustrates a timing diagram for a programming verify operation according to various embodiments.

FIG. 3 illustrates a timing diagram 300 for a programming verify operation according to various embodiments. FIG. 3 illustrates a signal WL coupled to a gate of a selected flash memory cell 202 being programmed. The programming verify operation takes place after the selected flash memory cell 202 receives a programming pulse. Also illustrated are a signal BLBIAS coupled to the gate of the bias transistor 210, a voltage BL of the bit-line 208, a signal PLOAD coupled to a gate of the load transistor 212, and a voltage SEN at a node between the load transistor 212 and the bias transistor 210. The signals LATEN0 and LATEN1 are coupled, respectively, to gates of the first and second latch transistors 220, 222 to switch the first and second latch transistors 220, 222 on and off. The signals LAT1, LAT2, LAT3, and LAT4 are coupled, respectively to switch on and off the inverters 230, 232, 240, and 242. The signals DATA0 and DATA1 indicate first and second digital data latched by the respective pairs of inverters 230, 232 and 240, 242 to indicate a state of the selected flash memory cell 202. The signals LATEN2, LAT5 and LAT6 are coupled to a latch transistor and inverters (not shown) to latch a signal DATA2 indicating third digital data to indicate a state of the selected flash memory cell 202. The latch transistor and inverters not shown are coupled to the data line 236 in parallel with the latch transistor 222 and the inverters 240 and 242 and function in the same manner.

At time $t_1$ in FIG. 3, the signal BLBIAS rises to a voltage Vclamp and the signal PLOAD goes low for significant pulses 304 and 302 to switch on the bias transistor 210 and the load transistor 212, respectively. The bit-line 208 is then coupled to the supply voltage Vcc through the load transistor 212 and the voltage BL on the bit-line 208 rises as the bit-line is charged to a voltage Vclamp less the threshold voltage $V_t$ of the bias transistor 210. Also at time $t_1$, the voltage WL on the gate of the selected flash memory cell 202 rises to a program verify (PV) level.

At the end of the pulses 302, 304, the bias transistor 210 and the load transistor 212 are switched off, and the voltage BL on the bit-line 208 remains the same or falls depending on the threshold voltage $V_t$ of the selected flash memory cell 202. The voltage BL on the bit-line 208 may stay the same or fall along one of several lines 305 as will be described below with reference to FIG. 4.

The programming verify operation now proceeds to latch DATA0, DATA1 and DATA2 across intervals to determine if the bit-line 208 is being discharged, and if so, what the rate of the discharge is. DATA0 is captured in the following manner.

The signal BLBIAS rises to a voltage less than Vclamp for a short voltage pulse 306 to switch on the bias transistor 210 to allow the voltage SEN to settle to the voltage BL of the bit-line 208. The voltage SEN is captured by the capacitance $C_{SEN}$ between the bias transistor 210 and the load transistor 212. The capacitance $C_{SEN}$ is much less than the capacitance $C_{BL}$ of the bit-line 208. The signals LAT1 and LAT2 go low for short pulses 308, 310 to switch off the inverters 230, 232, then the BLBIAS voltage pulse 306 ends to switch off the bias transistor 210 and the first latch transistor 220 is switched on by a pulse 312 of the signal LATEN0 to allow the voltage SEN to transfer from the capacitance $C_{SEN}$ to the input of the inverter 230. The inverters 230, 232 are switched off to avoid disturbing the transfer and are switched on in sequence at the end of the pulses 308, 310 to latch DATA0. DATA0 is low at 318 if the threshold voltage $V_t$ of the cell 202 is below PV1, and DATA0 is high at 318 if the threshold voltage $V_t$ of the cell 202 is above PV1.

DATA0 is then transferred to DATA1 in the following manner. At the end of pulse 310 the inverter 232 is switched on and the signals LAT3 and LAT4 go low for short pulses 320, 322 to switch off the inverters 240, 242. The first latch transistor 220 is switched off at the end of the pulse 312 when DATA0 is latched, and the second latch transistor 222 is switched on by a pulse 324 of the signal LATEN1 to allow the inverted DATA0 to transfer from the output of the inverter 230 to the input of the inverter 240. The inverters 240, 242 are switched off to avoid disturbing the transfer, and are switched on in sequence at the end of the pulses 320, 322 to latch DATA1. DATA1 at the output of the inverter 240 is the same as the previously latched DATA0 at the input of the inverter 230. The second latch transistor 222 is switched off at the end of pulse 324 after DATA1 has been latched. DATA1 is low at 328 if the threshold voltage $V_t$ of the cell 202 is below PV1, and DATA1 is high at 328 if the threshold voltage $V_t$ of the cell 202 is above PV1.

At the end of pulse 312 when the first latch transistor 220 is switched off, the signal PLOAD goes low for a short pulse 330 to switch on the load transistor 212 to raise the SEN voltage between the load transistor 212 and the bias transistor 210. The capacitance $C_{SEN}$ rises to a high voltage during the pulse 330, but the bit-line 208 below the bias transistor 210 is unaffected and the voltage BL continues its trend.

At the end of the pulse 330, the signal BLBIAS rises to a voltage less than Vclamp for a short pulse 340 to switch on the bias transistor 210 to allow the voltage SEN to settle to the voltage BL of the bit-line 208. The signals LAT1 and LAT2 go low again for short pulses 342, 344 to switch off the inverters 230, 232, then the BLBIAS pulse 340 ends to switch off the bias transistor 210 and the first latch transistor 220 is switched on by a pulse 346 of the signal LATEN0 to allow the voltage SEN to transfer from the capacitance $C_{SEN}$ to the input of the inverter 230. The inverters 230, 232 are switched on in sequence at the end of the pulses 342, 344 to latch a new DATA0 that is possibly different from the first latched DATA0. The first latch transistor 220 is switched off at the end of pulse 346. DATA0 is low at 348 if the threshold voltage $V_t$ of the cell 202 is below PV2, and DATA0 is high at 348 if the threshold voltage $V_t$ of the cell 202 is above PV2.

DATA0 is then transferred to DATA2 in the following manner. At the end of pulse 344 the inverter 232 is switched on and the signals LAT5 and LAT6 go low for short pulses 350, 352 to switch off the inverters not shown. The first latch transistor 220 is switched off at the end of the pulse 346 when DATA0 is latched, and the latch transistor not shown is switched on by a pulse 354 of the signal LATEN2 to allow the inverted DATA0 to transfer from the output of the inverter 230 to the input of the inverter not shown. The inverters not shown are switched off to avoid disturbing the transfer, and are switched on in sequence at the end of the pulses 350, 352 to latch DATA2. DATA2 is the same as the previously latched DATA0 at the input of the inverter 230. The latch transistor not shown is switched off at the end of pulse 354 after DATA2 has been latched. DATA2 is low at 358 if the threshold voltage $V_t$ of the cell 202 is below PV2, and DATA2 is high at 358 if the threshold voltage $V_t$ of the cell 202 is above PV2.

At the end of pulse 346 when the first latch transistor 220 is switched off, the signal PLOAD goes low for a short pulse 360 to switch on the load transistor 212 to raise the SEN voltage between the load transistor 212 and the bias transistor 210. The capacitance $C_{SEN}$ rises to a high voltage during the pulse 360, but the bit-line 208 below the bias transistor 210 is unaffected and the voltage BL continues its trend.

At the end of the pulse 360, the signal BLBIAS rises to a voltage less than Vclamp for a short pulse 370 to switch on the bias transistor 210 to allow the voltage SEN to settle to the voltage BL of the bit-line 208. The signals LAT1 and LAT2 go low again for short pulses 372, 374 to switch off the inverters 230, 232, then the BLBIAS pulse 370 ends to switch off the bias transistor 210 and the first latch transistor 220 is switched on by a pulse 376 of the signal LATEN0 to allow the voltage SEN to transfer from the capacitance $C_{SEN}$ to the input of the inverter 230. The inverters 230, 232 are switched on in sequence at the end of the pulses 372, 374 to latch a new DATA0 that is possibly different from the last latched DATA0. The first latch transistor 220 is switched off at the end of pulse 376. DATA0 is low at 378 if the threshold voltage $V_t$ of the cell 202 is below PV3, and DATA0 is high at 378 if the threshold voltage $V_t$ of the cell 202 is above PV3.

In this manner the bit-line 208 is strobed three times to obtain three data points DATA0, DATA1 and DATA2 separated by intervals while the same signal WL at the PV voltage is coupled to the gate of a selected flash memory cell 202 being programmed. According to various embodiments, the bit-line 208 is strobed four or more times to obtain four or more data points separated by intervals while the same signal WL at the PV voltage is coupled to the gate of a selected flash memory cell 202 being programmed.

The selected flash memory cell 202 may be read according to the timing diagram 300 according to various embodiments. The signal WL rises to a read voltage, and the bit-line 208 is strobed two or more times to obtain two or more data points representing two or more threshold voltages $V_t$ of the cell 202 separated by intervals. The data points may be coupled directly to the data line 236 and the controller 104 shown in FIG. 1 without a need for more than one latch.

Figure 4:
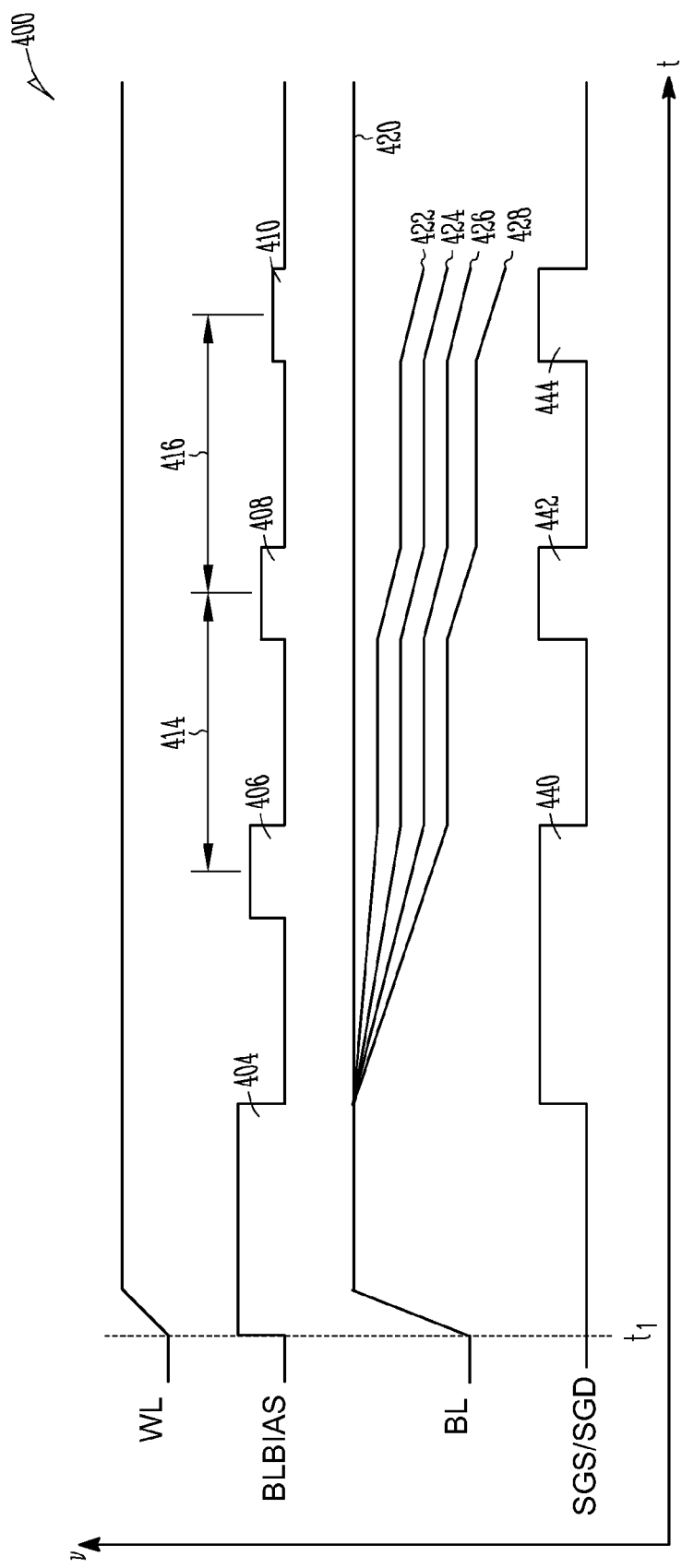
FIG. 4 illustrates a timing diagram for a programming verify operation according to various embodiments.

The magnitude or the timing of the BLBIAS pulses, or both, may be varied as is shown in FIG. 4. FIG. 4 illustrates a timing diagram 400 for a programming verify operation according to various embodiments. FIG. 4 illustrates a signal WL coupled to a gate of a selected flash memory cell 202 being programmed. The programming verify operation takes place after the selected flash memory cell 202 receives a programming pulse. Below the signal WL are illustrated a signal BLBIAS coupled to the gate of the bias transistor 210 and a voltage BL of the bit-line 208. Also illustrated coincidentally are the source select control signal SGS coupled to the control gate of the source select transistor 204 and the drain select control signal SGD that is coupled to the control gate of the drain select transistor 206. The signals SGS and SGD are the same according to various embodiments.

The signal PLOAD coupled to the gate of the load transistor 212 is not shown in FIG. 4, but is the same as the signal PLOAD shown in FIG. 3. The signals LATEN0, LATEN1, LATEN2, LAT1, LAT2, LAT3, LAT4, LAT5 and LAT6 are not shown in FIG. 4, but are the same as the corresponding signals shown in FIG. 3 and operate to latch the signals DATA0, DATA1 and DATA2 to indicate a state of the selected flash memory cell 202.

At time $t_1$ in FIG. 4, the signal BLBIAS rises to a voltage Vclamp for a significant pulse 404 and the signal PLOAD goes low to switch on the bias transistor 210 and the load transistor 212, respectively. The bit-line 208 is then coupled to the supply voltage Vcc through the load transistor 212 and the voltage BL on the bit-line 208 rises as the bit-line is charged to a voltage Vclamp less the threshold voltage $V_t$ of the bias transistor 210. Also at time $t_1$, the voltage WL on the gate of the selected flash memory cell 202 rises to a program verify (PV) level. At the end of the BLBIAS pulse 404, the bias transistor 210 and the load transistor 212 are switched off, and the voltage BL on the bit-line 208 remains the same or falls depending on the threshold voltage $V_t$ of the selected flash memory cell 202. As described above, the floating gate cells 202 in the nandstring other than the selected flash memory cell 202 are conductive during the programming verify operation.

Following the BLBIAS pulse 404, the bit-line 208 is strobed three times by succeeding BLBIAS pulses 406, 408 and 410. The magnitude of each BLBIAS pulse 406, 408 and 410 is different. The earlier BLBIAS pulse 406 has a voltage PV1. The middle BLBIAS pulse 408 has a voltage PV2 that is less than PV1. The later BLBIAS pulse 410 has a voltage PV3 that is less than PV2 meaning that each succeeding BLBIAS pulse has a lower voltage than the BLBIAS pulse that preceded it.

The BLBIAS pulses 406, 408 and 410 are separated from each other by approximately equal periods of time. The middle BLBIAS pulse 408 follows the earlier BLBIAS pulse 406 by a first time period 414. The later BLBIAS pulse 410 follows the middle BLBIAS pulse 408 by a second time period 416. The time periods 414 and 416 may be different according to various embodiments.

Following the BLBIAS pulse 404, the voltage BL on the bit-line 208 may stay the same along a line 420 or fall along one of several lines 422, 424, 426 and 428. If the threshold voltage $V_t$ of the selected flash memory cell 202 is below the voltage PV1 of the earlier BLBIAS pulse 406, the cell 202 will be rendered conductive and the bit-line 208 will discharge quickly along the line 428. If the threshold voltage $V_t$ of the cell 202 is approximately equal to PV1, the cell 202 will be rendered conductive and the bit-line 208 will discharge at a slightly more gradual slope along the line 426. If the threshold voltage $V_t$ of the cell 202 is approximately equal to the voltage PV2 of the middle BLBIAS pulse 408, the cell 202 will be rendered conductive and the bit-line 208 will discharge at a more gradual slope along the line 424. If the threshold voltage $V_t$ of the cell 202 is approximately equal to the voltage PV3 of the later BLBIAS pulse 410, the cell 202 will be rendered conductive and the bit-line 208 will discharge at an even more gradual slope along the line 422. If the threshold voltage $V_t$ of the cell 202 is above the voltage PV3, the cell 202 will not be conductive and the bit-line 208 will hold its charge, remaining at a high voltage along the line 420. The discharge of the bit-line 208 is influenced by its capacitance $C_{BL}$.

The voltage BL on the bit-line 208 may decline while the signals SGS and SGD are high to render the source select transistor 204 and the drain select transistor 206 conductive. The voltage BL on the bit-line 208 will stay substantially the same when the signals SGS and SGD are low and the source select transistor 204 and the drain select transistor 206 not conductive. The signals SGS and SGD are high for a long pulse 440 starting at the end of the BLBIAS pulse 404 and ending with the end of the earlier BLBIAS pulse 406. Thereafter, the signals SGS and SGD are high during the middle BLBIAS pulse 408 and the later BLBIAS pulse 410, and are otherwise low. The voltage BL on the bit-line 208 declines as shown by the lines 422, 424, 426 and 428 while the signals SGS and SGD are high, and stays substantially the same while the signals SGS and SGD are low.

The magnitude, or timing, or both the magnitude and timing of the BLBIAS pulses may change as is shown in FIGS. 5A-5F. FIGS. 5A-5F illustrate timing diagrams for a programming verify operation according to various embodiments. A different signal BLBIAS is illustrated in each of FIGS. 5A-5F that may be coupled to the gate of the bias transistor 210 instead of the signals BLBIAS illustrated in FIG. 3 or FIG. 4 according to various embodiments.

Figure 5A:
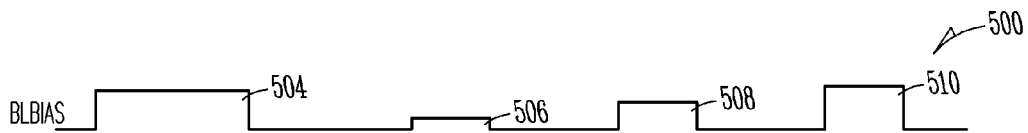
FIGS. 5A-5F illustrate timing diagrams for a programming verify operation according to various embodiments.

FIG. 5A illustrates a timing diagram 500 for a signal BLBIAS during a programming verify operation according to various embodiments. The signal BLBIAS rises to a voltage Vclamp for a significant pulse 504 to charge the bit-line 208 in a manner similar to the signal BLBIAS illustrated in FIG. 3. Following the BLBIAS pulse 504, the bit-line 208 is strobed three times by succeeding BLBIAS pulses 506, 508 and 510. The magnitude of each BLBIAS pulse 506, 508 and 510 is different. The earlier BLBIAS pulse 506 has a voltage PV1. The middle BLBIAS pulse 508 has a voltage PV2 that is greater than PV1. The later BLBIAS pulse 510 has a voltage PV3 that is greater than PV2 meaning that each succeeding BLBIAS pulse has a greater voltage than the BLBIAS pulse that preceded it.

Figure 5B:
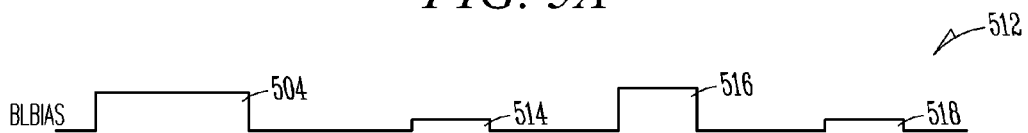

The magnitude of the BLBIAS pulses may increase and decrease as is shown in FIG. 5B. FIG. 5B illustrates a timing diagram 512 for a signal BLBIAS during a programming verify operation according to various embodiments. The BLBIAS pulse 504 charges the bit-line 208 in a manner similar to the signal BLBIAS illustrated in FIGS. 3 and 5A. Following the BLBIAS pulse 504, the bit-line 208 is strobed three times by succeeding BLBIAS pulses 514, 516 and 518. The magnitude of the BLBIAS pulses 514, 516 and 518 changes. The earlier BLBIAS pulse 514 has a voltage PV1. The middle BLBIAS pulse 516 has a voltage PV2 that is greater than PV1. The later BLBIAS pulse 518 has a voltage PV3 that is less than PV2 meaning that the middle BLBIAS pulse 516 has a greater voltage than the BLBIAS pulse 514 that preceded it and the BLBIAS pulse 518 that followed it. The voltage PV3 of the later BLBIAS pulse 518 may be the same or different from the voltage PV1 of the earlier BLBIAS pulse 514.

Figure 5C:
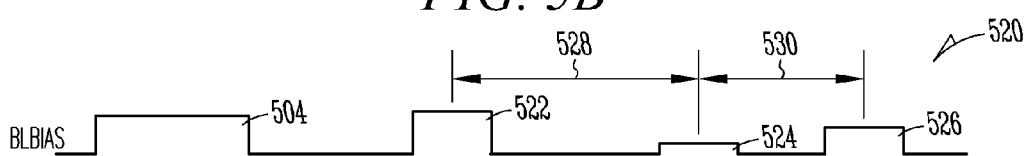

The timing of the BLBIAS pulses may change as is shown in FIG. 5C. FIG. 5C illustrates a timing diagram 520 for a signal BLBIAS during a programming verify operation according to various embodiments. The BLBIAS pulse 504 charges the bit-line 208 in a manner similar to the signal BLBIAS illustrated in FIGS. 3 and 5A. Following the BLBIAS pulse 504, the bit-line 208 is strobed three times by succeeding BLBIAS pulses 522, 524 and 526. The magnitude of the BLBIAS pulse 522, 524 and 526 changes. The earlier BLBIAS pulse 522 has a voltage PV1. The middle BLBIAS pulse 524 has a voltage PV2 that is less than PV1. The later BLBIAS pulse 526 has a voltage PV3 that is greater than PV2 meaning that the middle BLBIAS pulse 524 has a lower voltage than the than the BLBIAS pulse 522 that preceded it and the BLBIAS pulse 526 that followed it. The voltage PV3 of the later BLBIAS pulse 526 may be the same or different from the voltage PV1 of the earlier BLBIAS pulse 522. The timing of the BLBIAS pulses 522, 524 and 526 changes. The middle BLBIAS pulse 524 follows the earlier BLBIAS pulse 522 by a first time period 528. The later BLBIAS pulse 526 follows the middle BLBIAS pulse 524 by a second time period 530. The time period 530 is shorter than the time period 528 such that the later BLBIAS pulse 526 follows the middle BLBIAS pulse 524 more quickly than the middle BLBIAS pulse 524 follows the earlier BLBIAS pulse 522.

Figure 5D:
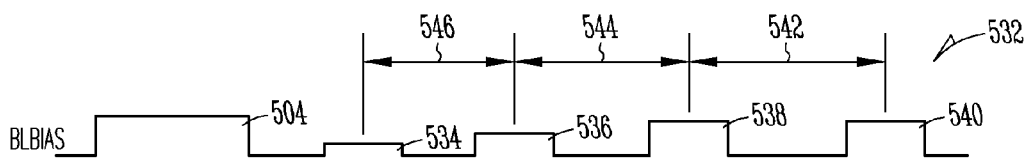

The timing of the BLBIAS pulses also changes in FIG. 5D. FIG. 5D illustrates a timing diagram 532 for a signal BLBIAS during a programming verify operation according to various embodiments. The BLBIAS pulse 504 charges the bit-line 208 in a manner similar to the signal BLBIAS illustrated in FIGS. 3 and 5A. Following the BLBIAS pulse 504, the bit-line 208 is strobed four times by succeeding BLBIAS pulses 534, 536, 538 and 540. The magnitude of the BLBIAS pulses 534, 536, 538 and 540 increases such that each of the BLBIAS pulses 536, 538 and 540 is has a higher voltage than the BLBIAS pulse that precedes it. The timing of the BLBIAS pulses 534, 536, 538 and 540 increases. The fourth BLBIAS pulse 540 follows the third BLBIAS pulse 538 by a later time period 542 that is longer than a middle time period 544 between the third BLBIAS pulse 538 and the second BLBIAS pulse 536. The middle time period 544 is longer than an earlier time period 546 between the second BLBIAS pulse 536 and the first BLBIAS pulse 534 such that each BLBIAS pulse 536, 538 and 540 follows the preceding BLBIAS pulse with a longer delay period between them.

Figure 5E:
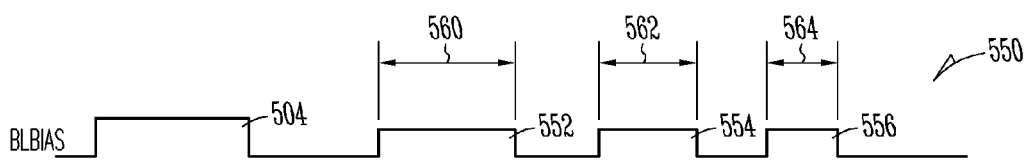

The duration of the BLBIAS pulses may decrease as is shown in FIG. 5E, another way in which the magnitude of the BLBIAS pulses may change. FIG. 5E illustrates a timing diagram 550 for a signal BLBIAS during a programming verify operation according to various embodiments. The BLBIAS pulse 504 charges the bit-line 208 in a manner similar to the signal BLBIAS illustrated in FIGS. 3 and 5A. Following the BLBIAS pulse 504, the bit-line 208 is strobed three times by succeeding BLBIAS pulses 552, 554 and 556. The earlier BLBIAS pulse 552 has a duration 560. The middle BLBIAS pulse 554 has a duration 562 that is less than the duration 560. The later BLBIAS pulse 556 has a duration 564 that is less than the duration 562 meaning that each BLBIAS pulse 554 and 556 has a shorter duration than the BLBIAS pulse that preceded it.

Figure 5F:
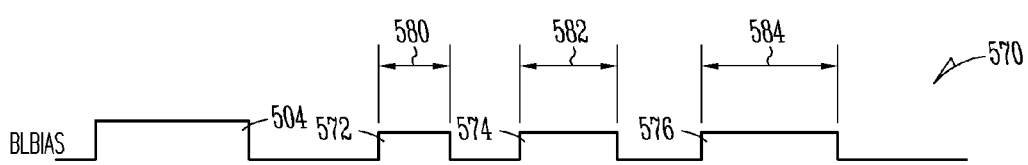

The duration of the BLBIAS pulses may increase as is shown in FIG. 5F, another way in which the magnitude of the BLBIAS pulses may change. FIG. 5F illustrates a timing diagram 570 for a signal BLBIAS during a programming verify operation according to various embodiments. The BLBIAS pulse 504 charges the bit-line 208 in a manner similar to the signal BLBIAS illustrated in FIGS. 3 and 5A. Following the BLBIAS pulse 504, the bit-line 208 is strobed three times by succeeding BLBIAS pulses 572, 574 and 576. The earlier BLBIAS pulse 572 has a duration 580. The middle BLBIAS pulse 574 has a duration 582 that is greater than the duration 580. The later BLBIAS pulse 576 has a duration 584 that is greater than the duration 582 meaning that each BLBIAS pulse 574 and 576 has a longer duration than the BLBIAS pulse that preceded it.

The magnitude of the BLBIAS pulses, including the duration, or the voltage, or both the duration and the voltage of the BLBIAS pulses, may increase and then decrease and then increase according to various embodiments. The magnitude of the BLBIAS pulses may also decrease and then increase and then decrease according to various embodiments. Time periods between BLBIAS pulses may increase and then decrease and then increase according to various embodiments. Time periods between BLBIAS pulses may also decrease and then increase and then decrease according to various embodiments.

The magnitude, or timing, or both the magnitude and timing of the BLBIAS pulses may be set during the manufacture of the memory system 100 or may be changed during the operation of the memory system 100 according to various embodiments.

Figure 6A:
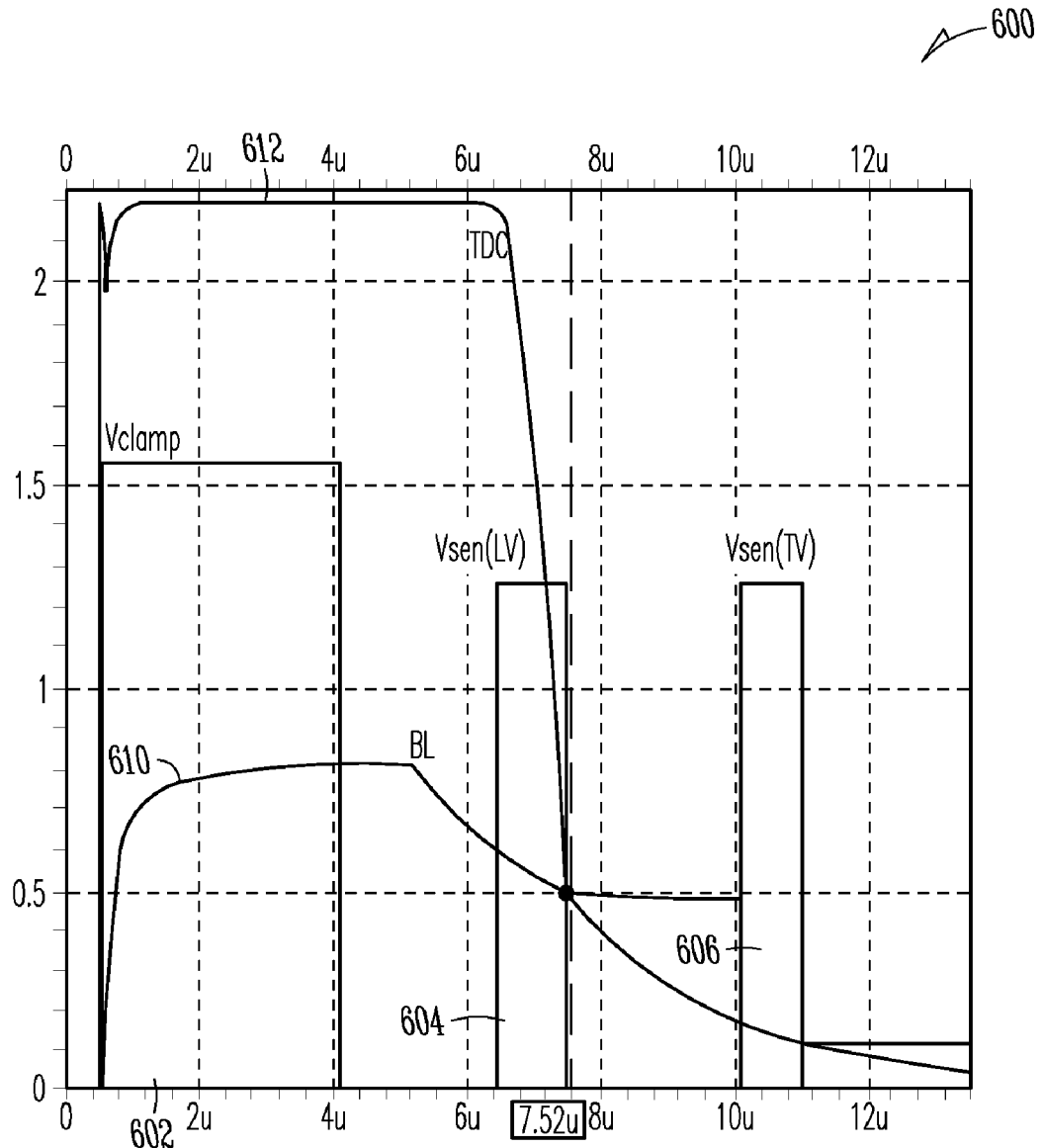
FIGS. 6A and 6B illustrate voltages for a programming verify operation according to various embodiments.
Figure 6B:
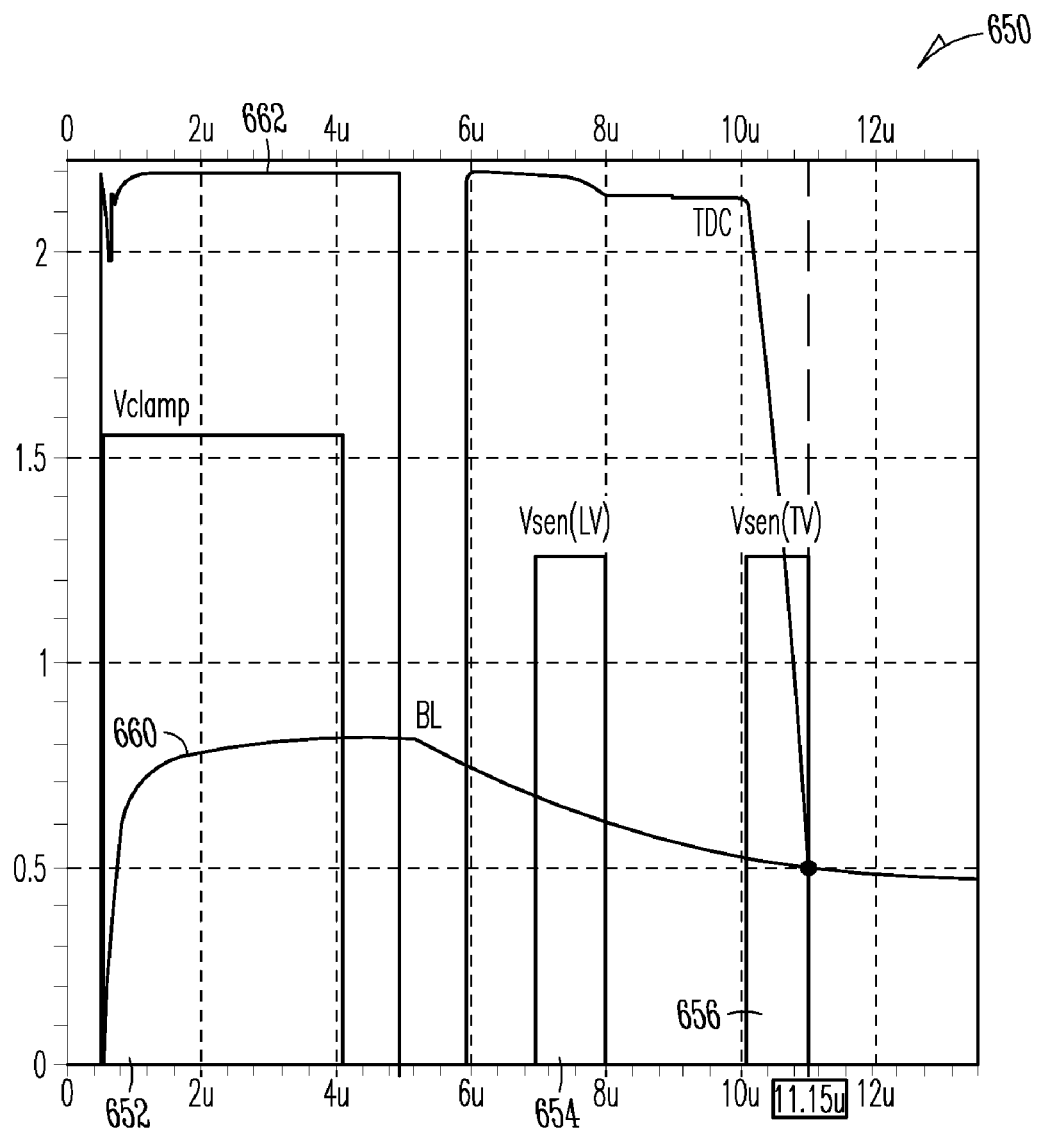

FIGS. 6A and 6B illustrate voltages for a programming verify operation according to various embodiments. FIG. 6A illustrates voltages 600 for a programming verify operation of a selected flash memory cell that has a threshold voltage $V_t$ below PPV. Illustrated are three pulses 602, 604, and 606 of the signal BLBIAS. The pulse 602 is at the voltage Vclamp, and the short pulses 604, 606 of the signal BLBIAS switch on the bias transistor 210 to allow the voltage SEN to settle to the voltage BL of the bit-line 208. Also illustrated in FIG. 6A is the voltage BL 610 and the voltage SEN 612. FIG. 6B illustrates voltages 650 for a programming verify operation of a selected flash memory cell that has a threshold voltage $V_t$ above PPV and below PV. Illustrated are three pulses 652, 654, and 656 of the signal BLBIAS. The pulse 652 is at the voltage Vclamp, and the short pulses 654, 656 of the signal BLBIAS switch on the bias transistor 210 to allow the voltage SEN to settle to the voltage BL of the bit-line 208. Also illustrated in FIG. 6B is the voltage BL 660 and the voltage SEN 662.

Figure 7:
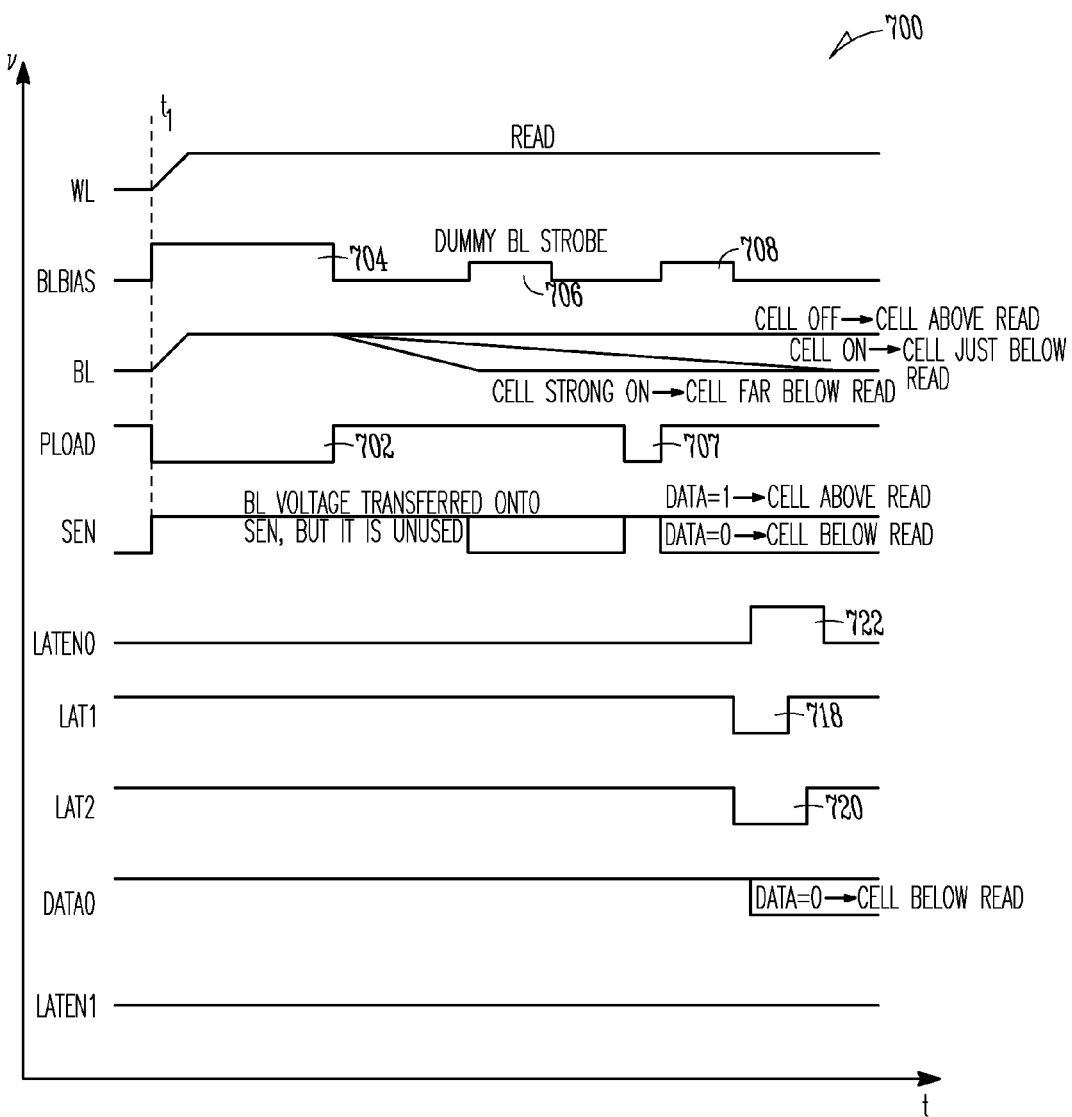
FIG. 7 illustrates a timing diagram for a read operation according to various embodiments.

FIG. 7 illustrates a timing diagram 700 for a read operation according to various embodiments. FIG. 7 illustrates a signal WL coupled to a gate of a selected flash memory cell 202 being read. Also illustrated are a signal BLBIAS coupled to the gate of the bias transistor 210; a voltage BL of the bit-line 208; a signal PLOAD coupled to a gate of the load transistor 212, and a voltage SEN at a node between the load transistor 212 and the bias transistor 210. The signals LATEN0 and LATEN1 are coupled, respectively, to gates of the first and second latch transistors 220, 222 to switch the first and second latch transistors 220, 222 on and off. The signals LAT1 and LAT2 are coupled, respectively to switch on and off the inverters 230 and 232. The signal DATA0 indicates digital data latched by the pair of inverters 230, 232 to indicate a state of the selected flash memory cell 202.

At time $t_1$ in FIG. 7, the signal BLBIAS rises to a voltage Vclamp and the signal PLOAD goes low for significant pulses 702 and 704 to switch on the load transistor 212 and the bias transistor 210, respectively. The bit-line 208 is then coupled to the supply voltage Vcc through the load transistor 212 and the voltage BL on the bit-line 208 rises as the bit-line is charged to a voltage Vclamp less the threshold voltage $V_t$ of the bias transistor 210. Also at time $t_1$, the voltage WL on the gate of the selected flash memory cell 202 rises to a read voltage.

At the end of the pulses 702, 704, the bias transistor 210 and the load transistor 212 are switched off, and the voltage BL on the bit-line 208 remains the same or falls depending on the state of the selected flash memory cell 202. If the threshold voltage $V_t$ of the cell 202 is far below the read voltage, the selected flash memory cell 202 will be rendered conductive and the bit-line 208 will discharge quickly. If the threshold voltage $V_t$ of the cell 202 is just below the read level, the cell 202 will be rendered conductive and the bit-line 208 will discharge at a more gradual slope. If the threshold voltage $V_t$ of the cell 202 is above the read voltage, the cell 202 will not be conductive and the bit-line 208 will hold its charge, remaining at a high voltage BL.

The signal BLBIAS rises to a voltage less than Vclamp for a short pulse 706 to switch on the bias transistor 210 to allow the voltage SEN to settle to the voltage BL of the bit-line 208. However, data is not latched during or after the pulse 706, but the pulse 706 is applied to mirror the pulse 306 described with respect to the programming verify operation illustrated in FIG. 3. The pulse 706 may be called a dummy BL strobe. The bit-line 208 is subject to the same signal BLBIAS during both the read operation and the programming verify operation such that the results of the two operations are the same. The application of the pulse 706 reduces the likelihood that data resulting from a read operation for the cell 202 will be different from data resulting from a programming verify operation for the cell 202.

Following the pulse 706, the signal PLOAD goes low for a short pulse 707 to switch on the load transistor 212 to raise the SEN voltage between the load transistor 212 and the bias transistor 210. The capacitance $C_{SEN}$ rises to a high voltage during the pulse 707, but the bit-line 208 below the bias transistor 210 is unaffected and the voltage BL continues its trend.

The read operation now proceeds to latch DATA0 to determine a state of the selected flash memory cell 202. The signal BLBIAS rises to a voltage less than Vclamp for a short pulse 708 to switch on the bias transistor 210 to allow the voltage SEN to settle to the voltage BL of the bit-line 208. The voltage SEN is captured by the capacitance $C_{SEN}$ between the bias transistor 210 and the load transistor 212. The signals LAT1 and LAT2 go low for short pulses 718, 720 to switch off the inverters 230, 232, then the BLBIAS pulse 708 ends to switch off the bias transistor 210 and the first latch transistor 220 is switched on by a pulse 722 of the signal LATEN0 to allow the voltage SEN to transfer from the capacitance $C_{SEN}$ to the input of the inverter 230. The inverters 230, 232 are switched off to avoid disturbing the transfer, and are switched on in sequence at the end of the pulses 718, 720 to latch DATA0. DATA0 is low if the threshold voltage $V_t$ of the selected flash memory cell 202 is below the read voltage, and is high if the threshold voltage $V_t$ of the selected flash memory cell 202 is above the read voltage. The signal LATEN1 is not active during the read operation because only one data value is latched.

Figure 8:
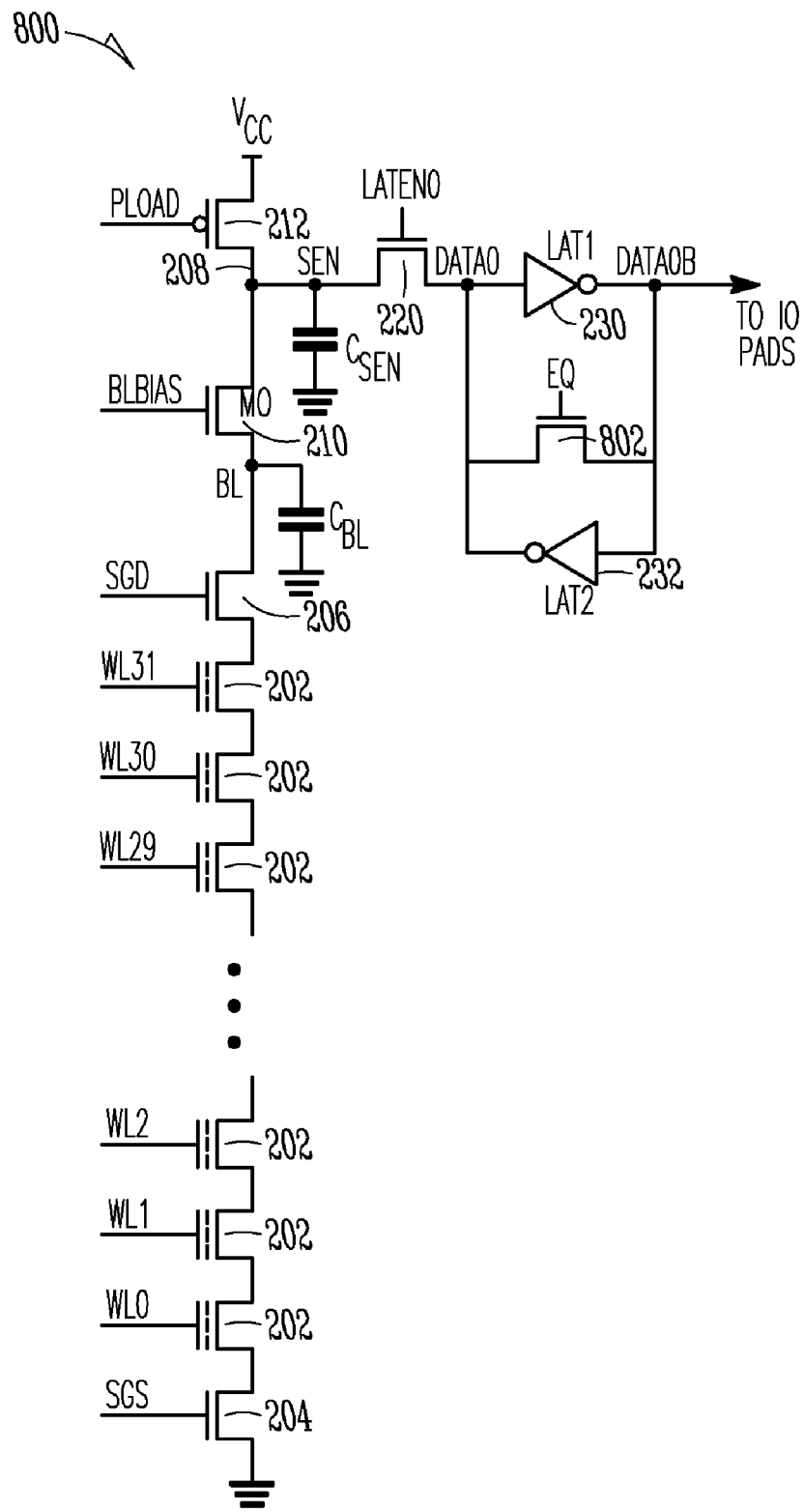
FIG. 8 illustrates an electrical schematic diagram of a memory circuit according to various embodiments.

FIG. 8 illustrates an electrical schematic diagram of a memory circuit 800 according to various embodiments. The memory circuit 800 includes many elements in common with the memory circuit 200 shown in FIG. 2, and similar elements, voltages, and signals are given the same reference numbers and letters for purposes of brevity. The elements common to the memory circuits 200 and 800 have the same function, position, and orientation in the respective circuit. The memory circuit 800 also includes an equalization transistor 802, an n-channel transistor having a source coupled to the input of the inverter 230 and a drain coupled to the output of the inverter 230. A control signal EQ is coupled to a gate of the equalization transistor 802. When rendered conductive by the signal EQ, the equalization transistor 802 permits charge transfer between the input and the output of the inverter 230 to reduce a potential difference between them and remove data latched by the inverters 230, 232 to initialize the latch. The bias transistor 210, the first latch transistor 220, and the inverters 230 and 232 are included in the cache memory for the memory circuit 800 as they perform the function of a cache memory.

Figure 9:
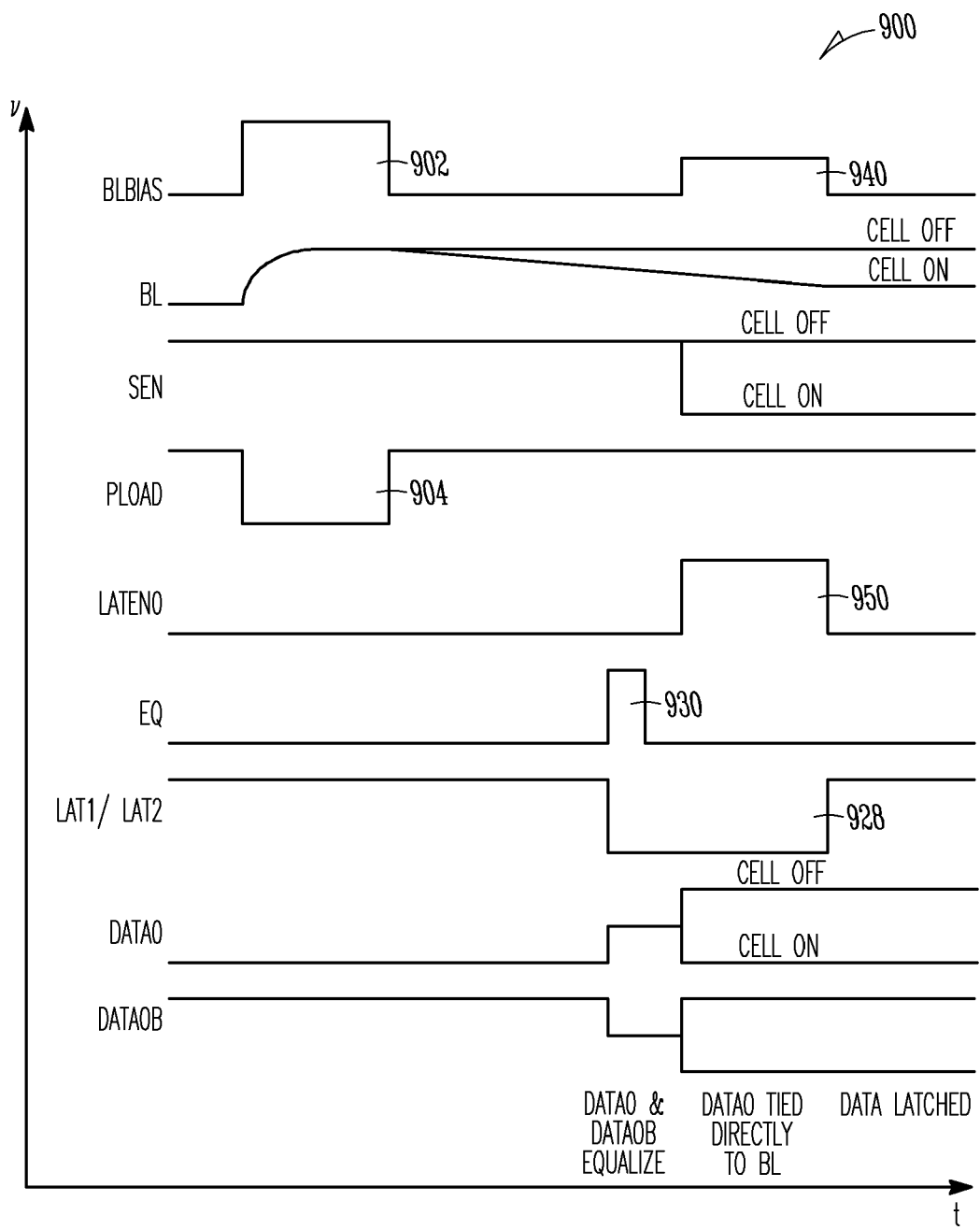
FIG. 9 illustrates a timing diagram for a read operation according to various embodiments.

FIG. 9 illustrates a timing diagram 900 for a read operation according to various embodiments. FIG. 9 illustrates a signal BLBIAS coupled to the gate of the bias transistor 210, a voltage BL of the bit-line 208, a voltage SEN at a node between the load transistor 212 and the bias transistor 210, and a signal PLOAD coupled to a gate of the load transistor 212. A signal LATEN0 is coupled to a gate of the first latch transistor 220 to switch the first latch transistor 220 on and off. A signal EQ is coupled to a gate of the equalization transistor 802. The signals LAT1 and LAT2 are the same and are coupled, respectively, to switch on and off the inverters 230 and 232. The signal DATA0 indicates digital data latched by the pair of inverters 230, 232 to indicate a state of the selected flash memory cell 202, and the signal DATA0B is the signal DATA0 inverted.

As the signals begin in the timing diagram 900, the signal BLBIAS rises to a voltage Vclamp and the signal PLOAD goes low for significant pulses 902 and 904 to switch on the load transistor 212 and the bias transistor 210, respectively. The bit-line 208 is then coupled to the supply voltage Vcc through the load transistor 212 and the voltage BL on the bit-line 208 rises as the bit-line is charged to a voltage Vclamp less the threshold voltage $V_t$ of the bias transistor 210. A read voltage (not shown) is coupled to a gate of a selected flash memory cell 202.

At the end of the pulses 902, 904 the bias transistor 210 and the load transistor 212 are switched off, and the voltage BL on the bit-line 208 remains the same or falls depending on the state of the selected flash memory cell 202. If the threshold voltage $V_t$ of the cell 202 is below the read voltage, the cell 202 will be rendered conductive and the bit-line 208 will discharge. If the threshold voltage $V_t$ of the cell 202 is above the read voltage, the cell 202 will not be conductive and the bit-line 208 will hold its charge, remaining at a high voltage BL.

Thereafter, the signal EQ goes high for a short pulse 930 to switch on the equalization transistor 802 to permit charge transfer between the input and the output of the inverter 230 to reduce a potential difference between them and remove data latched by the inverters 230, 232 to initialize the latch. At the same time the signals LAT1 and LAT2 are brought low for a longer pulse 928 to switch off the inverters 230 and 232.

Following the pulse 930 when the latch is initialized and the equalization transistor 802 is switched off, the signal BLBIAS rises to a voltage less than Vclamp for a short pulse 940 to switch on the bias transistor 210 to allow the voltage SEN to settle to the voltage BL of the bit-line 208. The voltage SEN is captured by the capacitance $C_{SEN}$ between the bias transistor 210 and the load transistor 212. At the same time the first latch transistor 220 is switched on by a pulse 950 of the signal LATEN0 to allow the voltage SEN to transfer from the capacitance $C_{SEN}$ to the input of the inverter 230. As a result, the bit-line 208 is coupled to the capacitance $C_{SEN}$ and to the input of the inverter 230 as the voltage BL is developing on the bit-line 208 and possibly discharging if the selected flash memory cell 202 is rendered conductive. The signal DATA0 is coupled directly from the voltage BL on the bit-line 208 during the pulses 928, 940, and 950.

The BLBIAS pulse 940, the LATEN0 pulse 950, and the LAT1/LAT2 pulse 928 all end at the same time to switch off the bias transistor 210 and the first latch transistor 220 and switch on the inverters 230, 232 to latch DATA0. DATA0 is low if the threshold voltage $V_t$ of the selected flash memory cell 202 is below the read voltage and is high if the threshold voltage $V_t$ of the selected flash memory cell 202 is above the read voltage. The signal DATA0B is the signal DATA0 inverted.

Figure 10:
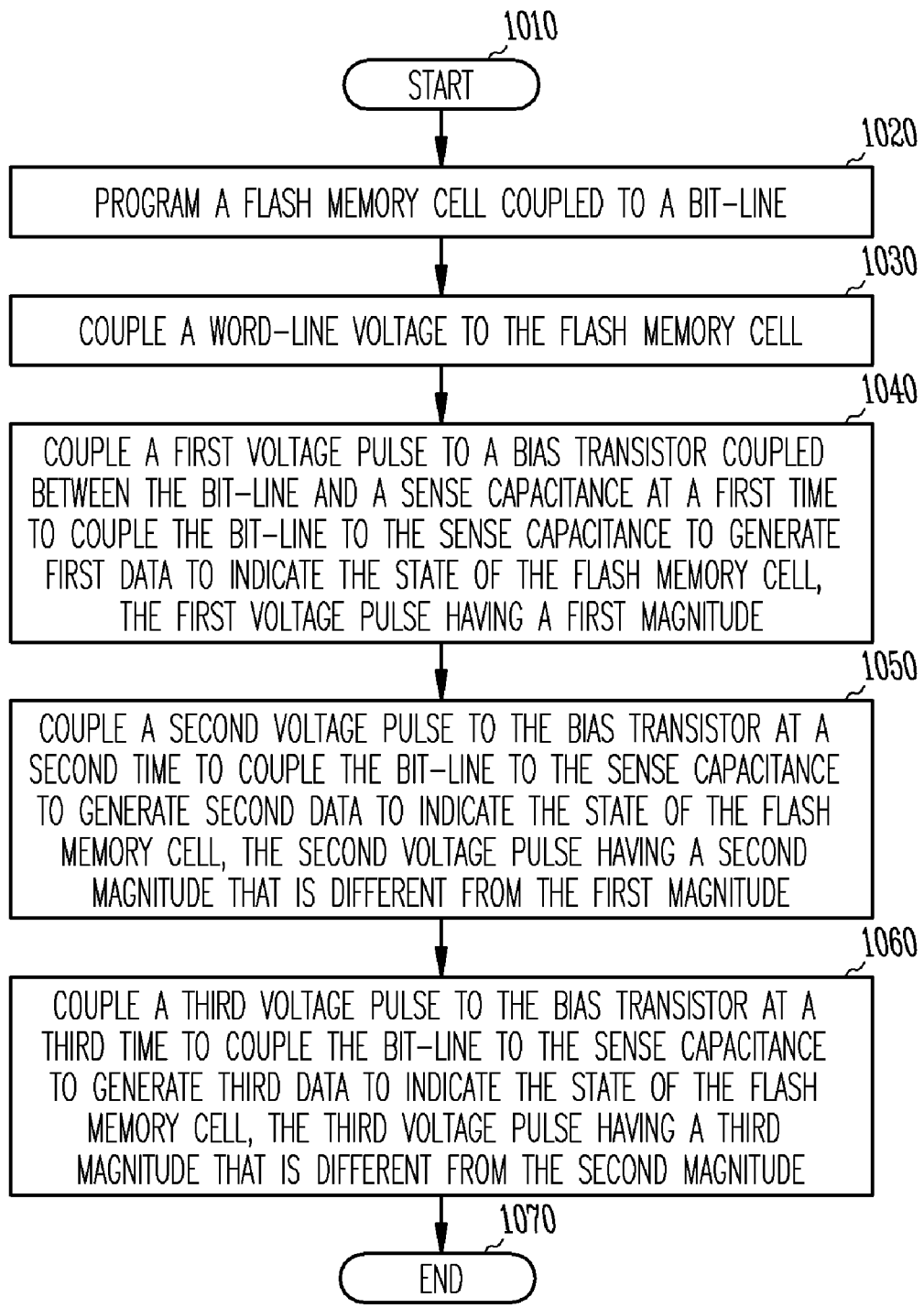
FIG. 10 illustrates a flow diagram of several methods according to various embodiments.

FIG. 10 illustrates a flow diagram of several methods according to various embodiments. In 1010, the methods start.

In 1020, a flash memory cell coupled to a bit-line is programmed.

In 1030, a word-line voltage is coupled to the flash memory cell.

In 1040, a first voltage pulse is coupled to a bias transistor coupled between the bit-line and a sense capacitance at a first time to couple the bit-line to the sense capacitance to generate first data to indicate the state of the flash memory cell, the first voltage pulse having a first magnitude.

In 1050, a second voltage pulse is coupled to the bias transistor at a second time to couple the bit-line to the sense capacitance to generate second data to indicate the state of the flash memory cell, the second voltage pulse having a second magnitude that is different from the first magnitude.

In 1060, a third voltage pulse is coupled to the bias transistor at a third time to couple the bit-line to the sense capacitance to generate third data to indicate the state of the flash memory cell, the third voltage pulse having a third magnitude that is different from the second magnitude.

In 1070, the methods end.

Figure 11:
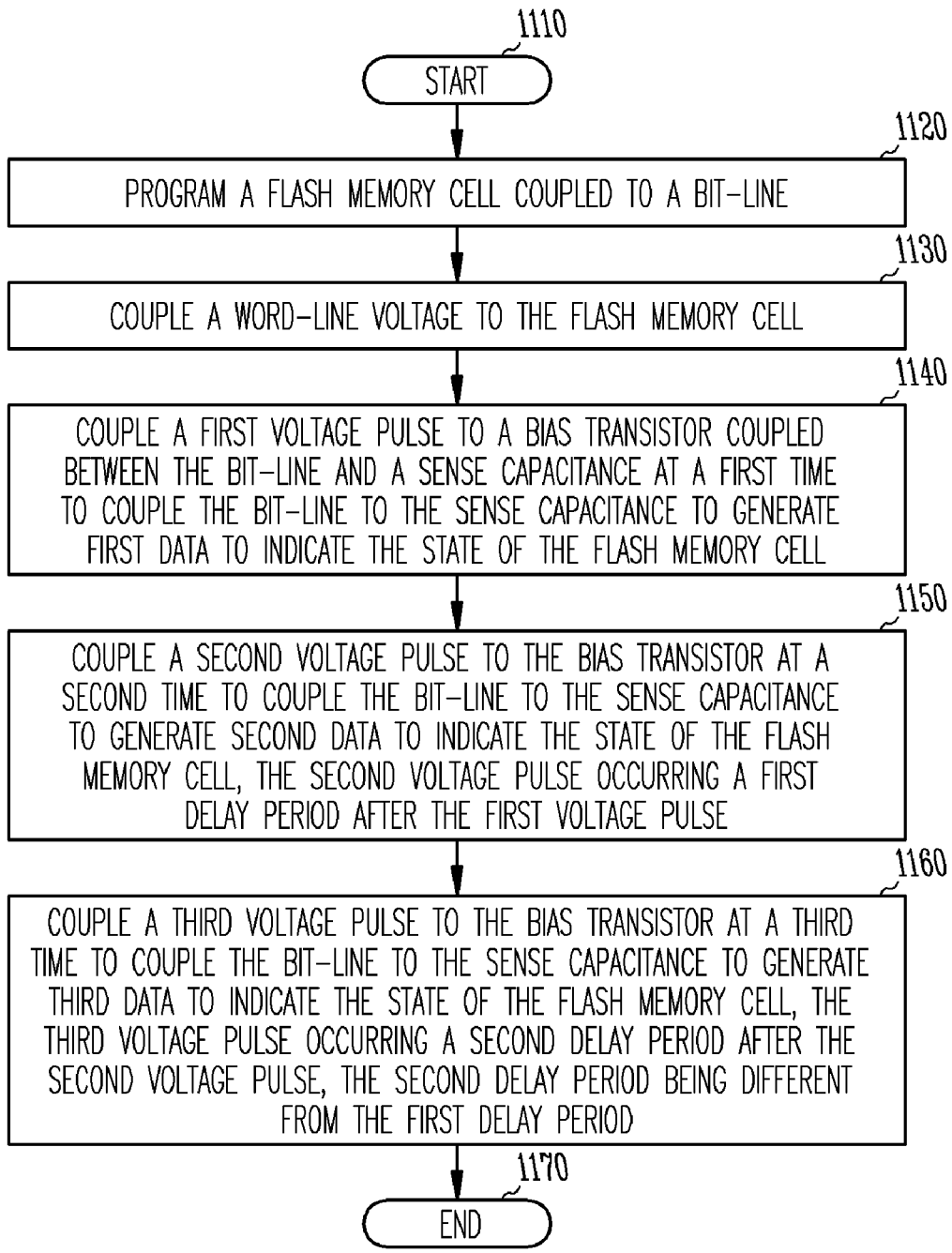
FIG. 11 illustrates a flow diagram of several methods according to various embodiments.

FIG. 11 illustrates a flow diagram of several methods according to various embodiments. In 1110, the methods start.

In 1120, a flash memory cell coupled to a bit-line is programmed.

In 1130, a word-line voltage is coupled to the flash memory cell.

In 1140, a first voltage pulse is coupled to a bias transistor coupled between the bit-line and a sense capacitance at a first time to couple the bit-line to the sense capacitance to generate first data to indicate the state of the flash memory cell.

In 1150, a second voltage pulse is coupled to the bias transistor at a second time to couple the bit-line to the sense capacitance to generate second data to indicate the state of the flash memory cell, the second voltage pulse occurring a first delay period after the first voltage pulse.

In 1160, a third voltage pulse is coupled to the bias transistor at a third time to couple the bit-line to the sense capacitance to generate third data to indicate the state of the flash memory cell, the third voltage pulse occurring a second delay period after the second voltage pulse, the second delay period being different from the first delay period.

In 1170, the methods end.

Figure 12:
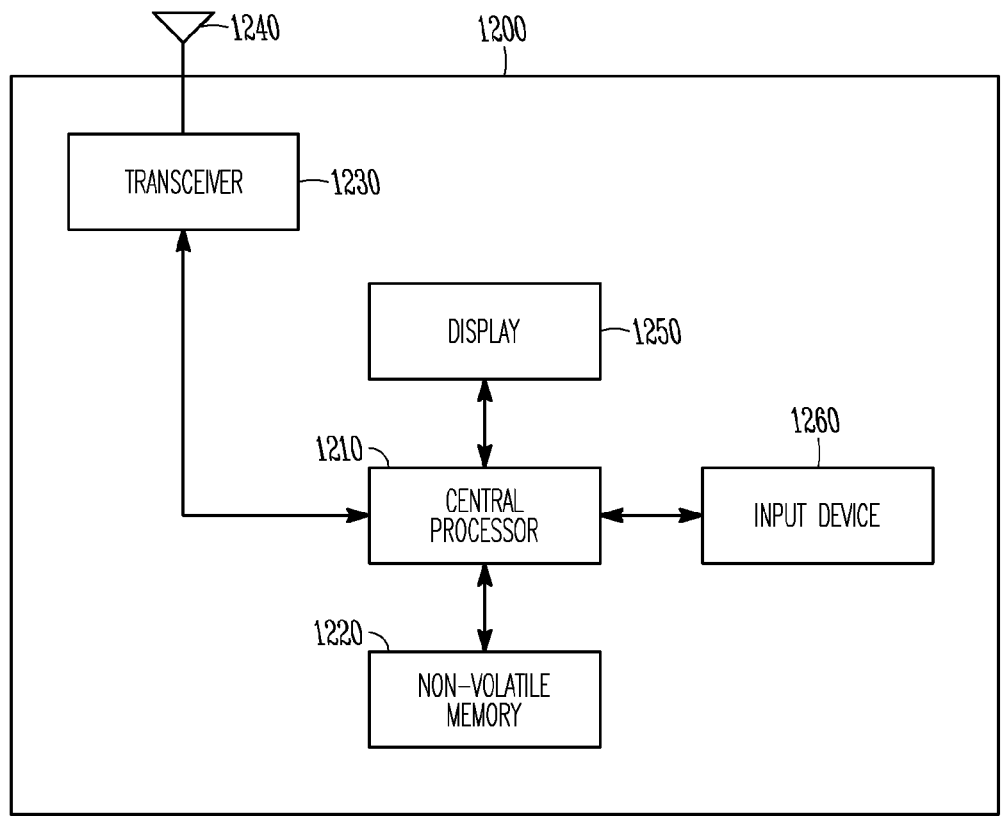
FIG. 12 illustrates a block diagram of a mobile data processing machine according to various embodiments.

FIG. 12 illustrates a block diagram of a mobile data processing machine 1200 according to various embodiments. The machine 1200 may also be called an article. The machine 1200 includes a central processor 1210 and a non-volatile memory 1220, such as described above. The non-volatile memory 1220 may be an electrically erasable and programmable non-volatile memory, such as an EEPROM. The machine 1200 further includes instructions used to program operational characteristics of the non-volatile memory 1220 in accordance with functions and methods according to various embodiments described herein. The machine 1200 also may include a transceiver 1230 such as a radio transceiver, and an antenna 1240, a display 1250, and/or an input device 1260. The machine 1200 may be a cellular telephone, a personal digital assistant (PDA), a laptop, a digital camera, etc. The non-volatile memory 1220 provides storage of programs and/or data for the machine 1200, including during a powered down state.

The central processor 1210 is a machine and may be a processor, a microprocessor, a state machine, or an application-specific integrated circuit that is a computer-readable medium, or is coupled to a computer-readable medium or a machine-accessible medium such as a memory, in a computer-based system to execute functions and methods according to various embodiments described herein. The memory may be the non-volatile memory 1220 or may include electrical, optical, or electromagnetic elements. The computer-readable medium or a machine-accessible medium may contain associated information such as computer program instructions, data, or both which, when accessed, results in a machine performing the activities described herein.

The machine 1200 is a wireless computing platform according to various embodiments. The machine 1200 may interact with one or more networks such as a WAN (Wireless Area Network), a WLAN (Wireless Local Area Network), and a WPAN (Wireless Personal Area Network). The machine 1200 may be hand-held or larger. The antenna 1240 may comprise a monopole, a dipole, a unidirectional antenna, an omnidirectional antenna, or a patch antenna, among others. A wireless computing platform may be any device capable of conducting wireless communication (e.g., infrared, radio frequency, etc.) and executing a series of programmed instructions (e.g., a personal digital assistant, a laptop, a cellular telephone, etc.).

Figure 13:
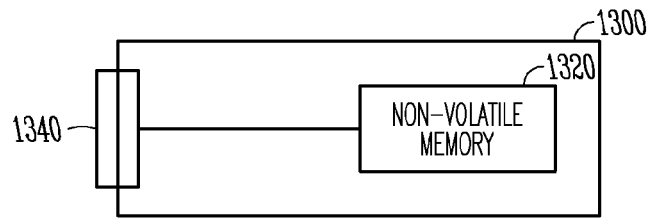
FIG. 13 illustrates a block diagram of a memory component according to various embodiments.

FIG. 13 illustrates a block diagram of a memory component 1300 according to various embodiments. The memory component 1300 may be called an article. The memory component 1300 may be a memory card, a memory chip, a memory stick, etc. The memory component 1300 includes a non-volatile memory 1320, such as describe above, which may be an electrically erasable and programmable non-volatile memory, such as an EEPROM. The memory component 1300 also includes a connector 1340, and may further include instructions used to program operational characteristics of the non-volatile memory 1320 in accordance with functions and methods according to various embodiments described herein. Alternatively, these instructions may be provided when the memory component 1300 is installed in a machine, such as the machines 104 or 1200, using the connector 1340.

The various embodiments illustrated and described herein may be implemented in a not AND (NAND) flash memory device or other types of memory devices. The various embodiments illustrated and described herein may be implemented with floating gate transistor memory cells that have one of two threshold voltages $V_t$, or with multi-state floating gate transistor memory cells holding one of four or more threshold voltages $V_t$.

Although specific embodiments have been illustrated and described herein, it should be appreciated that any arrangement calculated to achieve the same purpose may be substituted for the specific embodiments shown. This disclosure is intended to cover any and all adaptations or variations of various embodiments. It is to be understood that the above description has been made in an illustrative fashion, and not a restrictive one. Combinations of the above embodiments, and other embodiments not specifically described herein will be apparent to those of skill in the art upon reviewing the above description. Thus, the scope of various embodiments includes any other applications in which the above compositions, structures, and methods are used.

It is emphasized that the Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment. In the appended claims, the terms "including" and "in which" may be used as the plain-English equivalents of the respective terms "comprising" and "wherein," respectively. Moreover, the terms "first," "second," and "third," etc. are used merely as labels, and are not intended to impose numerical requirements on their objects.

The invention claimed is:

1. A method comprising:
   programming a flash memory cell coupled to a bit-line;
   coupling a word-line voltage to the flash memory cell;
   coupling a first voltage pulse to a bias transistor coupled between the bit-line and a sense capacitance at a first time to couple the bit-line to the sense capacitance to generate first data to indicate the state of the flash memory cell, the first voltage pulse having a first magnitude; and
   coupling a second voltage pulse to the bias transistor at a second time to couple the bit-line to the sense capacitance to generate second data to indicate the state of the flash memory cell wherein a duration of the second voltage pulse is different from a duration of the first voltage pulse.

2. The method of claim 1 wherein a voltage of the second voltage pulse is different from a voltage of the first voltage pulse.

3. A method comprising:
   programming a flash memory cell coupled to a bit-line;
   coupling a word-line voltage to the flash memory cell;
   coupling a first voltage pulse to a bias transistor coupled between the bit-line and a sense capacitance at a first time to couple the bit-line to the sense capacitance to generate first data to indicate the state of the flash memory cell, the first voltage pulse having a first magnitude;
   coupling a second voltage pulse to the bias transistor at a second time to couple the bit-line to the sense capacitance to generate second data to indicate the state of the flash memory cell, the second voltage pulse having a second magnitude that is different from the first magnitude; and
   coupling a third voltage pulse to the bias transistor at a third time to couple the bit-line to the sense capacitance to generate third data to indicate the state of the flash memory cell wherein a duration of the third voltage pulse is different from a duration of the second voltage pulse.

4. The method of claim 3 wherein a voltage of the third voltage pulse is different from a voltage of the second voltage pulse.

5. The method of claim 1, further comprising:
   comparing a first voltage of the sense capacitance with a reference voltage to generate the first data;
   comparing a second voltage of the sense capacitance with the reference voltage to generate the second data; and
   storing the second data in a first latch and storing the first data in a second latch.

6. The method of claim 3 wherein:
   a voltage of the second voltage pulse is different from a voltage of the first voltage pulse;
   a voltage of the third voltage pulse is different from a voltage of the second voltage pulse; and
   the voltage of the third voltage pulse is different from the voltage of the first voltage pulse.

7. The method of claim 1 wherein programming a flash memory cell includes programming a multi-state flash memory cell holding one of four or more threshold voltages to an erased state or to one of three or more threshold voltages.

8. A method comprising:
   programming a flash memory cell coupled to a bit-line;
   coupling a word-line voltage to the flash memory cell;
   coupling a first voltage pulse to a bias transistor coupled between the bit-line and a sense capacitance at a first time to couple the bit-line to the sense capacitance to generate first data to indicate the state of the flash memory cell;
   coupling a second voltage pulse to the bias transistor at a second time to couple the bit-line to the sense capacitance to generate second data to indicate the state of the flash memory cell, the second voltage pulse occurring a first delay period after the first voltage pulse; and
   coupling a third voltage pulse to the bias transistor at a third time to couple the bit-line to the sense capacitance to generate third data to indicate the state of the flash memory cell, the third voltage pulse occurring a second delay period after the second voltage pulse, the second delay period being different from the first delay period wherein a duration of the second voltage pulse is different from a duration of the first voltage pulse and a duration of the third voltage pulse is different from a duration of the second voltage pulse.

9. The method of claim 8 wherein:
   the first voltage pulse has a first magnitude;
   the second voltage pulse has a second magnitude that is different from the first magnitude; and
   the third voltage pulse has a third magnitude that is different from the second magnitude.

10. The method of claim 8 wherein:
    a voltage of the second voltage pulse is different from a voltage of the first voltage pulse; and
    a voltage of the third voltage pulse is different from a voltage of the second voltage pulse.

11. A system comprising:
    a unidirectional antenna;
    a display; and
    an article including a machine-accessible medium having associated information, wherein the information results in a machine performing:
    programming a flash memory cell coupled to a bit-line;
    coupling a word-line voltage to the flash memory cell;
    coupling a first voltage pulse to a bias transistor coupled between the bit-line and a sense capacitance at a first time to couple the bit-line to the sense capacitance to generate first data to indicate the state of the flash memory cell;
    coupling a second voltage pulse to the bias transistor at a second time to couple the bit-line to the sense capacitance to generate second data to indicate the state of the flash memory cell; and
    coupling a third voltage pulse to the bias transistor at a third time to couple the bit-line to the sense capacitance to generate third data to indicate the state of the flash memory cell wherein the second voltage pulse has a voltage that is less than a voltage of the first voltage pulse and the third voltage pulse has a voltage that is less than the voltage of the second voltage pulse.

12. The system of claim 11 wherein:
the second voltage pulse occurs a first delay period after the first voltage pulse; and
the third voltage pulse occurs a second delay period after the second voltage pulse, the second delay period being greater than the first delay period.

13. The system of claim 11 wherein:
the second voltage pulse occurs a first delay period after the first voltage pulse; and
the third voltage pulse occurs a second delay period after the second voltage pulse, the second delay period being less than the first delay period.

14. The system of claim 11 wherein the information results in a machine performing:
coupling a bit-line coupled to the flash memory cell to a sense capacitance at a first time to generate first data;
latching the first data in a first latch;
coupling the bit-line to the sense capacitance at a second time to generate second data; and
latching the second data in a second latch.

15. The system of claim 11 wherein the information results in a machine performing:
coupling the bit-line to the sense capacitance according to a plurality of read voltage pulses to read a state of the flash memory cell, the plurality of read voltage pulses having the same duration and occurring at the same intervals, respectively, as the first voltage pulse, the second voltage pulse and the third voltage pulse such that the bit-line is coupled to the sense capacitance at the same intervals when a programming of the flash memory cell is being verified and when the flash memory cell is being read.

* * * * *